(12) United States Patent
Wang

(10) Patent No.: US 10,262,566 B2
(45) Date of Patent: Apr. 16, 2019

(54) SHIFT REGISTER, GATE DRIVING CIRCUIT AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Fei Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/541,426

(22) PCT Filed: Jan. 16, 2017

(86) PCT No.: PCT/CN2017/071257
§ 371 (c)(1),
(2) Date: Jul. 3, 2017

(87) PCT Pub. No.: WO2017/193627
PCT Pub. Date: Nov. 16, 2017

(65) Prior Publication Data
US 2018/0218660 A1    Aug. 2, 2018

(30) Foreign Application Priority Data
May 13, 2016    (CN) .................... 2016 2 0444497 U

(51) Int. Cl.
*G06F 3/038* (2013.01)
*G09G 5/00* (2006.01)
(Continued)

(52) U.S. Cl.
CPC ............... *G09G 3/20* (2013.01); *G09G 3/36* (2013.01); *G11C 19/28* (2013.01); *G09G 2310/0286* (2013.01); *G09G 2310/061* (2013.01)

(58) Field of Classification Search
CPC ............... G09G 2310/0286; G09G 3/3677
See application file for complete search history.

(56) References Cited

U.S. PATENT DOCUMENTS

2009/0040203 A1* 2/2009 Kim .................... G09G 3/3677
345/204
2012/0326955 A1* 12/2012 Ohara ................. G09G 3/3677
345/92
(Continued)

FOREIGN PATENT DOCUMENTS

CN         204406959 U    6/2015
CN         105118473 A   12/2015
(Continued)

OTHER PUBLICATIONS

International Search Report and Written Opinion in PCT/CN2017/071257 dated Mar. 30, 2017, with English translation.

*Primary Examiner* — Nan-Ying Yang
(74) *Attorney, Agent, or Firm* — Womble Bond Dickinson (US) LLP

(57) ABSTRACT

A shift register is disclosed which includes at least one shift register unit group. Each shift register unit group includes a plurality of stages of shift register units cascaded to one another, each of the plurality of stages of shift register units including a pull-up node and a pull-up node reset terminal. The pull-up node of an (n+k)-th stage of shift register unit of each shift register unit group is connected to the pull-up node reset terminal of an n-th stage of shift register unit of
(Continued)

the shift register unit group. Also disclosed are a gate driving circuit and a display apparatus.

18 Claims, 6 Drawing Sheets

(51) Int. Cl.
*G09G 3/36* (2006.01)
*G09G 3/20* (2006.01)
*G11C 19/28* (2006.01)

(56) References Cited

U.S. PATENT DOCUMENTS

2015/0187320 A1* 7/2015 Ren .................. G09G 3/3696
    345/87
2017/0102814 A1    4/2017 Xu et al.

FOREIGN PATENT DOCUMENTS

| CN | 204966019 U | 1/2016 |
|----|-------------|--------|
| CN | 205595037 U | 9/2016 |
| KR | 20160019301 A | 2/2016 |

\* cited by examiner

SHIFT REGISTER, GATE DRIVING CIRCUIT AND DISPLAY APPARATUS

CROSS-REFERENCE TO RELATED APPLICATIONS

The present application is the U.S. national phase entry of PCT/CN2017/071257, with an international filing date of Jan. 16, 2017, which claims the benefit of Chinese Patent Application No. 201620444497.0, filed on May 13, 2016, the entire disclosures of which are incorporated herein by reference.

TECHNICAL FIELD

The present disclosure relates to the field of display technology, and particularly to a shift register, a gate driving circuit and a display apparatus.

BACKGROUND

An existing gate driving circuit comprises a shift register comprised of cascaded shift register units. In such a shift register, reset of a previous stage of shift register unit is usually enabled by an output signal of a next stage of shift register unit. Therefore, a signal output terminal of each stage of shift register unit bears a load of a reset signal terminal of a previous stage of shift register unit, leading to a high output load and a deteriorated output signal waveform (e.g., a less steep falling edge).

SUMMARY

Embodiments of the present disclosure provide a shift register, a gate driving circuit and a display apparatus to mitigate, alleviate or eliminate at least one of the problems described above.

According to a first aspect of the present disclosure, a shift register is provided comprising at least one shift register unit group each comprising a plurality of stages of shift register units cascaded to one another, each of the plurality of stages of shift register units comprising a pull-up node and a pull-up node reset terminal. The pull-up node of an (n+k)-th stage of shift register unit of each shift register unit group is connected to the pull-up node reset terminal of an n-th stage of shift register unit of the shift register unit group to provide a pull-up node reset signal allowing a potential at the pull-up node of the n-th stage of shift register unit to reset, the reset of the potential at the pull-up node causing an output signal at a signal output terminal of the n-th stage of shift register unit to reset. n is an integer larger than or equal to 1, and k is an integer larger than 1.

In some embodiments, each of the plurality of stages of shift register units further comprises a signal input terminal, a signal output terminal, a first clock signal terminal, a second clock signal terminal, an input module, a pull-up module, a pull-down module, a pull-down control module, a pull-up node reset module and a reference level input terminal. The input module has an input terminal connected with the signal input terminal and an output terminal connected with the pull-up node, and the input module is configured to put the input terminal and the output terminal of the input module in conduction in response to receipt of an active signal at the input terminal of the input module. The pull-up module has an input terminal connected to the first clock signal terminal, an output terminal connected with the signal output terminal, and a control terminal connected with the pull-up node, and the pull-up module is configured to put the input terminal and the output terminal of the pull-up module in conduction in response to receipt of an active signal at the control terminal of the pull-up module. The pull-down module has an input terminal connected with the reference level input terminal, an output terminal connected with the signal output terminal, and a control terminal connected with the pull-down node, and the pull-down module is configured to put the input terminal and the output terminal of the pull-down module in conduction in response to receipt of an active signal at the control terminal of the pull-down module. The pull-down control module has an input terminal connected with the second clock signal terminal, an output terminal connected with the pull-down node, and a control terminal connected with the pull-up node, and the pull-down control module is configured to put the input terminal and the output terminal of the pull-down control module in conduction in response to receipt of an active signal at the control terminal of the pull-down control module. The pull-up node reset module has an input terminal connected with the reference level input terminal, an output terminal connected with the pull-up node, and a control terminal connected with the pull-up node reset terminal.

In some embodiments, the input module comprises a first input transistor and a second input transistor. The first input transistor has a first electrode, a gate electrode connected with the first electrode and formed as the input terminal of the input module, and a second electrode formed as the output terminal of the input module. The second input transistor has a first electrode connected with the first electrode of the first input transistor, a gate electrode connected with the second clock signal terminal, and a second electrode connected with the second electrode of the first input transistor.

In some embodiments, the pull-up module comprises: a pull-up transistor having a gate electrode formed as the control terminal of the pull-up module, a first electrode formed as the input terminal of the pull-up module, and a second electrode formed as the output terminal of the pull-up module; and a storage capacitor having a first terminal connected with the pull-up node and a second terminal connected with the signal output terminal.

In some embodiments, the pull-down module comprises a pull-down transistor having a gate electrode formed as the control terminal of the pull-down module, a first electrode formed as the output terminal of the pull-down module, and a second electrode formed as the input terminal of the pull-down module.

In some embodiments, the pull-down control module comprises a first pull-down control transistor, a second pull-down control transistor, a third pull-down control transistor, a fourth pull-down control transistor and a fifth pull-down control transistor. The first pull-down control transistor has a gate electrode and a first electrode jointly connected with the second clock signal terminal, and a second electrode. The second pull-down control transistor has a gate electrode connected with the second electrode of the first pull-down control transistor, a first electrode connected with the second clock signal terminal, and a second electrode connected with the pull-down node. The third pull-down control transistor has a gate electrode connected with the pull-up node, a first electrode connected with the second electrode of the first pull-down control transistor, and a second electrode connected with the reference level input terminal. The fourth pull-down control transistor has a gate electrode connected with the pull-up node, a first electrode connected with the pull-down node, and a second electrode connected with the reference level input terminal. The fifth pull-down control transistor has a gate electrode connected with the second clock signal terminal, a first electrode connected with the signal output terminal, and a second electrode connected with the reference level input terminal.

In some embodiments, the pull-up node reset module comprises: a first reset transistor having a gate electrode connected with the pull-up node reset terminal, a first electrode connected with the pull-up node, and a second electrode connected with the reference level input terminal; and a second reset transistor having a gate electrode connected with the pull-down node, a first electrode connected with the pull-up node, and a second electrode connected with reference level input terminal.

In some embodiments, each of the plurality of stages of shift register units further comprises an output reset module having an input terminal connected with the reference level input terminal, an output terminal connected with the signal output terminal, and a control terminal.

In some embodiments, for each of the plurality of stages of shift register units, the control terminal of the output reset module is connected with the pull-up node reset terminal of the shift register unit.

In some embodiments, the signal output terminal of an (n+1)-th stage of shift register unit of each shift register unit group is connected to the control terminal of the output reset module of an n-th stage of shift register unit of the shift register unit group.

In some embodiments, the output reset module comprises an output reset transistor having a gate electrode formed as the control terminal of the output reset module, a first electrode formed as the output terminal of the output reset module, and a second electrode formed as the input terminal of the output reset module.

In some embodiments, the shift register comprises two shift register unit groups.

In some embodiments, each shift register unit group further comprises k stages of dummy shift register units to provide respective pull-up node reset signals for last k stages of shift register units in the shift register unit group.

According to another aspect of the present disclosure, a gate driving circuit is provided comprising the shift register as described above.

According to a further aspect of the present disclosure, a display apparatus is provided comprising the gate driving circuit as described above.

In some embodiments, the shift register comprises two shift register unit groups, wherein one shift register unit group is used to provide scanning signals to odd rows of gate lines of the display apparatus, and the other shift register unit group is used to provide scanning signals to even rows of gate lines of the display apparatus.

According to embodiments of the present disclosure, the reset of the n-th stage of shift register unit can be enabled by a signal from the pull-up node of the (n+k)-th stage of shift register unit, without necessarily the output signal from a next stage of shift register unit. In an application of a gate driver, the output signals of respective stages of shift register units may therefore be used, to a larger extent, to drive respective gate lines, thereby improving the driving capability of the gate driver. This may, in turn, improve a charging efficiency of the pixel units and thus a display quality of the display apparatus.

BRIEF DESCRIPTION OF THE DRAWINGS

The drawings are intended to provide further understanding of the present disclosure, which form a part of the specification to illustrate, together with the following detailed description, the present disclosure, and are not to be construed as limiting of the present disclosure. In the drawings.

DETAILED DESCRIPTION

Embodiments of the present disclosure will be described in detail in conjunction with the drawings. It should be appreciated that the embodiments described herein are only intended to describe and illustrate the present disclosure, not to limit the present disclosure.

LISTINGS OF THE REFERENCE SIGNS

| | |
|---|---|
| 1011, 1012, 1013, 1021, 1022, 1023: shift register unit | |
| 100: input module | 200: pull-up module |
| 300: pull-down module | 400: pull-down control module |
| 500: pull-up node reset module | 600: output reset module |

Herein, an active signal refers to a signal that enables a component having received it to turn on, and an inactive signal refers to a signal that enables a component having received it to turn off.

Figure 1:
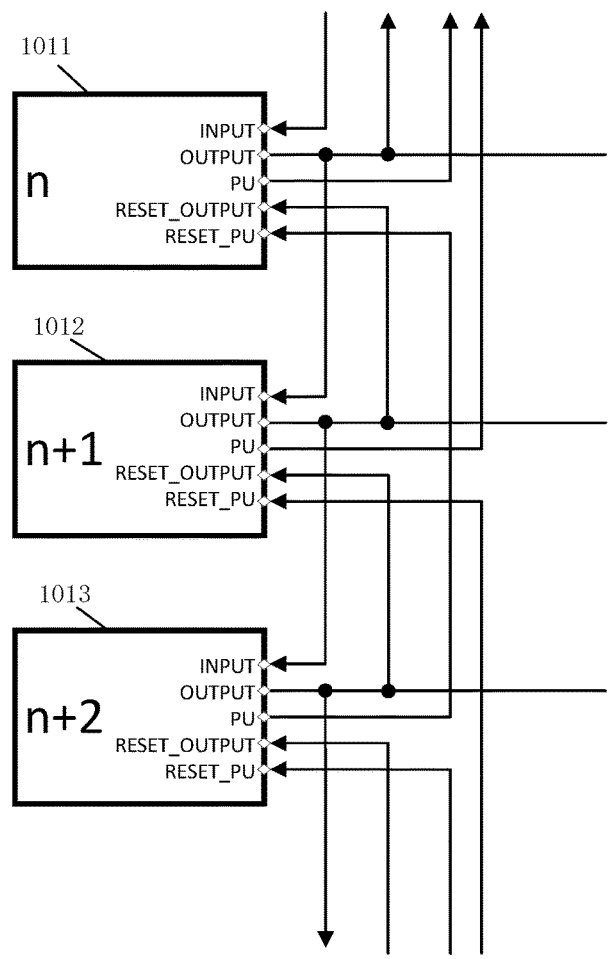
FIG. 1 is a schematic diagram of a shift register according to an embodiment of the present disclosure.

FIG. 1 is a schematic diagram of a shift register according to an embodiment of the present disclosure. As shown in FIG. 1, the shift shifter comprises a shift register unit group including multiple stages of shift register units. For simplicity, only three stages of shift register units are shown, i.e., an n-th stage of shift register unit 1011, an (n+1)-th stage of shift register unit 1012 and an (n+2)-th stage of shift register unit 1013.

The shift register units are cascaded to one another. In the example of FIG. 1, a signal output terminal OUTPUT of the n-th stage of shift register unit is connected to a signal input terminal INPUT of the (n+1)-th stage of shift register unit to provide an input signal to the (n+1)-th stage of shift register unit.

In particular, a pull-up node PU of the (n+k)-th stage of shift register unit is connected to a pull-up node reset terminal RESET_PU of the n-th stage of shift register unit to provide a pull-up node reset signal allowing a potential at the pull-up node PU of the n-th stage of shift register unit to reset. n is an integer larger than or equal to 1, and k is an integer larger than 1 (k=2 in the example of FIG. 1). As will be described later, the reset of the potential at the pull-up node of each shift register unit may enable an output signal at the signal output terminal OUTPUT of the shift register unit to reset, and thus the output reset terminal RESET_OUTPUT is not necessary.

When the shift register is used as a gate driver in a display apparatus, the output signals of respective shift register units serve as scanning signals applied to gate lines of the display apparatus. According to embodiments of the present disclosure, the reset of the n-th stage of shift register unit can be enabled by a signal from the pull-up node of the (n+k)-th stage of shift register unit, without necessarily requiring the output signal from a next stage of shift register unit. Therefore, in an application of the gate driver, the output signals of respective stages of shift register unit may be used, to a larger extent, to drive respective gate electrode lines, thereby improving the driving capability of the gate driver. This may in turn improve the charging efficiency of pixel units and thus the display quality of the display apparatus.

Figure 2:
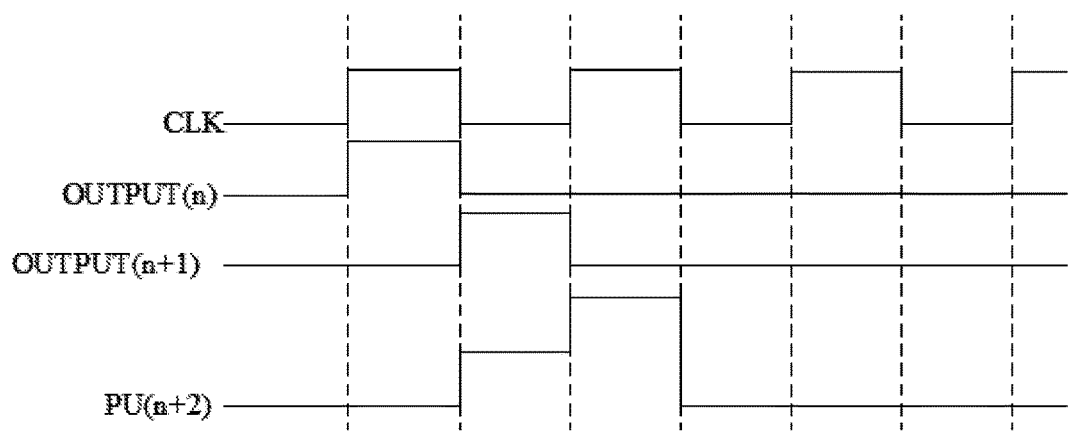
FIG. 2 is a timing diagram of the shift register as shown in FIG. 1, in which a first clock signal, an output signal of an n-th stage of shift register unit, an output signal of an (n+1)-th shift register unit, and a potential at a pull-up node of an (n+2)-th stage of shift register unit are shown.

FIG. 2 is a timing diagram of the shift register as shown in FIG. 1, wherein a first clock signal CLK, an output signal OUTPUT(n) of the n-th stage of shift register unit, an output signal OUTPUT(n+1) of the (n+1)-th shift register unit, and a potential PU(n+2) at the pull-up node of the (n+2)-th stage of shift register unit are shown. As shown in FIG. 2, when the signal output terminal OUTPUT(n) of the n-th stage of shift register unit outputs an active signal (e.g., a high level), the signal output terminal OUTPUT(n+1) of the (n+1)-th stage of shift resister unit outputs an inactive signal (e.g., a low level), and the potential PU(n+2) at the pull-up node of the (n+2)-th stage of shift register unit is an inactive signal. In a next phase, when the signal output terminal OUTPUT(n) of the n-th stage of shift register unit outputs an inactive signal, the signal output terminal OUTPUT(n+1) of the (n+1)-th stage of shift resister unit outputs an active signal, and the potential PU(n+2) at the pull-up node of the (n+2)-th stage of shift register unit is an active signal. At this time, the active PU(n+2) is provided to the pull-up node reset terminal RESET_PU of the n-th stage of shift register unit to allow the potential at the pull-up node PU of the n-th stage of shift register unit to reset, and further cause the output signal at the signal output terminal OUTPUT(n) of the n-th stage of shift register unit to reset.

Although the shift register in FIG. 1 is shown as including one shift register unit group, the present disclosure is not so limited. For example, the shift register may comprise two or more shift register unit groups. In the examples shown in FIG. 5 and FIG. 7, the shift register units 1011, 1012 and 1013 belong to the same shift register unit group, and the shift register units 1021, 1022 and 1023 belong to the same shift register unit group.

Figure 3:
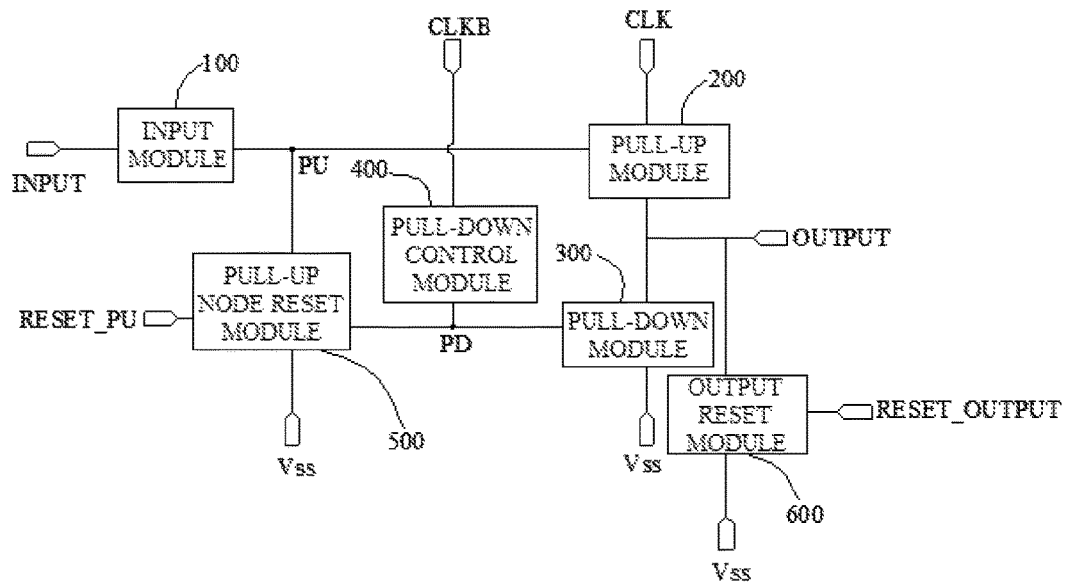
FIG. 3 is a block diagram of a shift register unit in a shift register according to an embodiment of the present disclosure.

FIG. 3 is a block diagram of a shift register unit in a shift register according to an embodiment of the present disclosure. As shown in FIG. 3, the shift register unit comprises a signal input terminal INPUT, a signal output terminal OUTPUT, a first clock signal terminal CLK, a second clock signal terminal CLKB, an input module 100, a pull-up module 200, a pull-down module 300, a pull-down control module 400, a pull-up node reset module 500 and a reference level input terminal Vss. The signal provided by the reference level input terminal Vss is an inactive signal. A first clock signal input by the first clock signal terminal CLK has a phase opposite to that of a second clock signal input by the second clock signal terminal CLKB. Moreover, in the output phase in which the output signal of the signal output terminal OUTPUT is an active signal (a high level in the example shown in FIG. 2), the signal output by the first clock signal terminal CLK is an active signal. As stated above, the output reset terminal RESET_OUTPUT (and a potentially the output reset module 600) is not necessary.

An input terminal of the input module 100 is connected with the signal input terminal INPUT, and the output terminal of the input module 100 is connected with the pull-up node PU. The input module 100 can put its input terminal and output terminal in conduction upon receipt of an active signal at its input terminal. In an input phase of the output shift register unit, an active signal is provided to the input terminal of the input module 100 via the signal input terminal INPUT, and the input terminal and the output terminal of the input module 100 are in conduction. Therefore, the pull-up node is charged with the active signal input via the signal input terminal INPUT.

An input terminal of the pull-up module 200 is connected with the first clock signal terminal CLK, an output signal of the pull-up module 200 is connected with the signal output terminal OUTPUT, and a control terminal of the pull-up module 200 is connected with the pull-up node. When the control terminal of the pull-up module 200 receives the active signal, the input terminal and the output terminal of the pull-up module 200 are in conduction. When the input terminal and the output terminal of the pull-up module 200 are in conduction, the signal output by the pull-up module 200 is the first clock signal input via the first clock signal terminal CLK. That is, when the first clock signal is an active signal, the active signal may be output via the signal output terminal OUTPUT.

An input terminal of the pull-down module 300 is connected with the reference level input terminal Vss, an output terminal of the pull-down module 300 is connected with the signal output OUTPUT, and a control terminal of the pull-down module 300 is connected with the pull-down node PD. When the control terminal of the pull-down module 300 receives an active signal, the input terminal and the output terminal of the pull-down module 300 are in conduction. In an output reset phase of the shift register unit, an active signal may be provided to the pull-down node PD to put the input terminal and the output terminal of the pull-down module 300 in conduction. At this time, an inactive signal input by the reference level input terminal Vss is output to the signal output terminal OUTPUT, thus resetting the output signal.

An input terminal of the pull-down control module 400 is connected with the second clock signal terminal CLKB, an output terminal of the pull-down control module 400 is connected with the pull-down node, and a control terminal of the pull-down control module 400 is connected with the pull-up node. The pull-down control module 400, the pull-down control module 400 can put its input terminal and output terminal in conduction upon receipt of a high level signal at its control terminal, thereby providing the second clock signal input via the second clock signal terminal CLKB to the pull-down node.

An input terminal of the pull-up node reset module 500 is connected with the reference level input terminal Vss, an output terminal of the pull-up node reset module 500 is connected with the pull-up node, and a control terminal of the pull-up node reset module 500 is connected with the pull-up node reset terminal RESET_PU. As stated above, the pull-up node reset terminal RESET_PU of the n-th stage of shift register unit is connected with the pull-up node PU of the (n+k)-th stage of shift register unit. Therefore, when the pull-up node PU of the (n+k)-th stage of shift register unit outputs an active signal, the input terminal and the output terminal of the pull-up node reset module 500 of the n-th stage of shift register unit are in conduction. At this time, an inactive signal input by the reference level input terminal Vss is provided to the pull-up node to reset the pull-up node.

Figure 4:
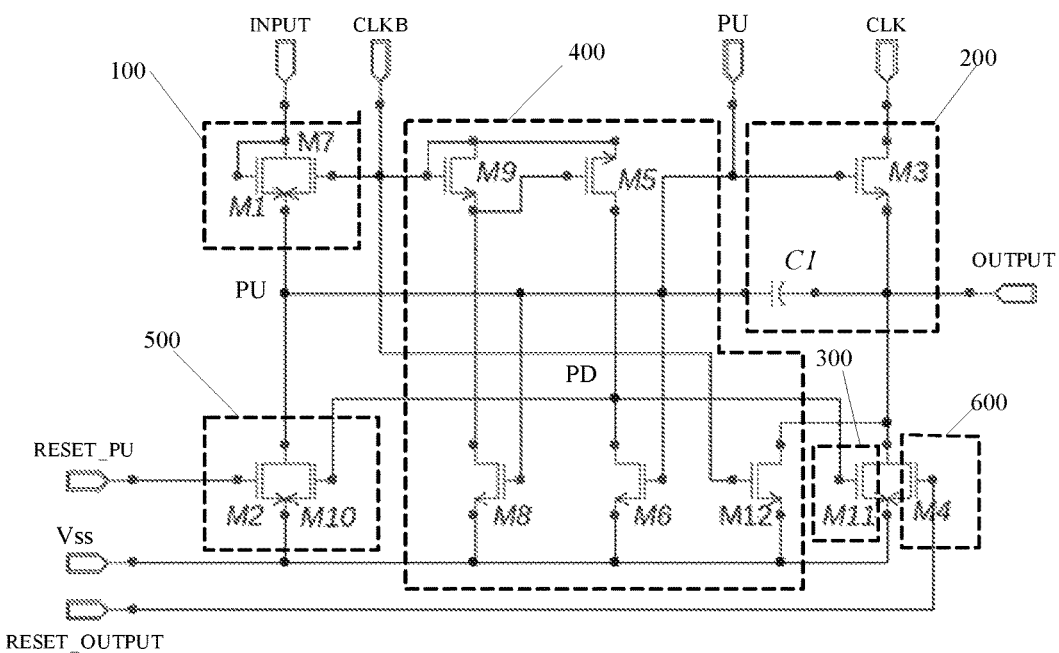
FIG. 4 is an exemplary circuit diagram of the shift register unit as shown in FIG. 3.
Figure 6:
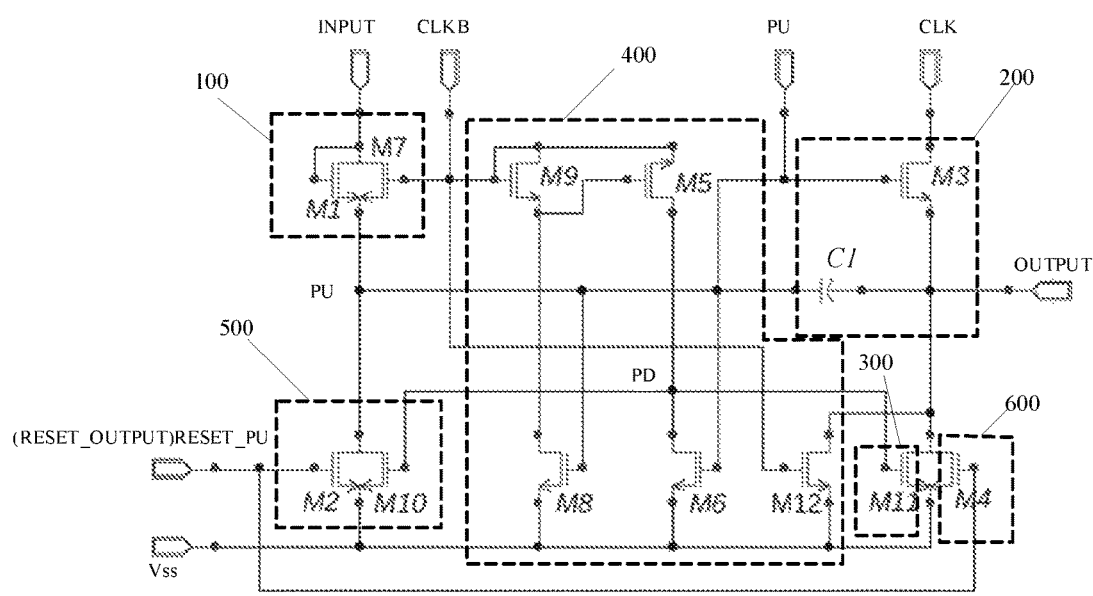
FIG. 6 is another exemplary circuit diagram of the shift register unit as shown in FIG. 3.

FIG. 4 and FIG. 6 are exemplary circuit diagrams of the shift register unit as shown in FIG. 3.

As shown in the figures, the input module 100 comprises a first input transistor M1 and a second input transistor M7. A gate electrode and a first electrode of the first input transistor M1 are connected, forming the input terminal of the input module 100 for connection with the signal input terminal INPUT. A second electrode of the first input transistor M1 and a second electrode of the second input transistor M2 are connected, forming the input terminal of the input module 100 for connection with the pull-up node. A gate electrode of the second input transistor M7 is connected with the second clock signal terminal CLKB, and a first electrode of the second input transistor M7 is connected with the first electrode of the first input transistor M1.

When an active signal is input to the signal input terminal INPUT, the signal input via the second clock signal terminal CLKB is also an active signal. At this time, both the first input transistor M1 and the second input transistor M7 are in conduction, thereby charging the pull-up node PU through the input module 100.

The pull-up module 200 comprises a pull-up transistor M3 and a storage capacitor C1. A gate electrode of the pull-up transistor M3 is formed as a control terminal of the pull-up module 200 for connection with the pull-up node. A first electrode of the pull-up transistor M3 is formed as an input terminal of the pull-up module 200 for connection with the first clock signal terminal CLK. A second electrode of the pull-up transistor M3 is formed as an output terminal of the pull-up module 200 for connection with the signal output terminal OUTPUT. A first terminal of the storage capacitor C1 is connected with the pull-up node, and a second terminal of the storage capacitor C1 is connected with the signal output terminal OUTPUT. When no signals are input via the signal input terminal INPUT any more, the storage capacitor C1 can keep the pull-up node PU at an active potential. When the pull-up node reset terminal RESET_PU is provided with an active signal, the potential at the pull-up node PU is reset. At this time, due to a boosting effect of the storage capacitor C1, the output signal at the signal output terminal OUTPUT is also reset. That is, the reset of the potential at the pull-up node PU may cause the output signal at the signal output terminal OUTPUT to reset.

The pull-down module 300 comprises a pull-down transistor M11. A gate electrode of the pull-down transistor M11 is formed as a control terminal of the pull-down module 300 for connection with the pull-down node PD. A first electrode of the pull-down transistor M11 is formed as an output terminal of the pull-down module 300 for connection with the signal output terminal OUTPUT. A second electrode of the pull-down transistor 300 is formed as an input terminal of the pull-down module 300 for connection with the reference level input terminal Vss.

When the gate electrode of the pull-down transistor M11 receives an active signal, the pull-down transistor M11 is turned on, transmitting an inactive signal input via the reference level input terminal Vss to the signal output terminal OUTPUT to reset the signal output terminal OUTPUT in an output reset phase.

The pull-down control module 400 comprises a first pull-down control transistor M9, a second pull-down control transistor M5, a third pull-down control transistor M8, a fourth pull-down control transistor M6 and a fifth pull-down control transistor M12. A gate electrode and a first electrode of the first pull-down control transistor M9 are connected with the second clock signal terminal CLKB, and a second electrode of the first pull-down control transistor M9 is connected with a gate electrode of the second pull-down control transistor M5. A second electrode of the second pull-down control transistor M5 is connected with the pull-down node PD. A gate electrode of the third pull-down control transistor M8 is connected with the pull-up node, a first electrode of the third pull-down control transistor M8 is connected with the second electrode of the first pull-down control transistor M9, and a second electrode of the third pull-down control transistor M8 is connected with the reference level input terminal Vss. A gate electrode of the fourth pull-down control transistor M6 is connected with the pull-up node, a first electrode of the fourth pull-down control transistor M6 is connected with the pull-down node, and a second electrode of the fourth pull-down control transistor M6 is connected with the reference level input terminal Vss. A gate electrode of the fifth pull-down control transistor M12 is connected with the second clock signal terminal CLKB, a first electrode of the fifth pull-down control transistor M12 is connected with the signal output terminal OUTPUT, and a second electrode of the fifth pull-down control transistor M12 is connected with the reference level input terminal Vss.

The pull-up node reset module 500 comprises a first reset transistor M2 and a second reset transistor M10. A gate electrode of the first reset transistor M2 is connected with the pull-up node reset terminal RESET_PU, a second electrode of the first reset transistor M2 is connected with the reference level input terminal Vss, and a first electrode of the first reset transistor M2 is connected with the pull-up node. A gate electrode of the second reset transistor M10 is connected with the pull-down node PD, a first electrode of the second reset transistor M10 is connected with the pull-up node, and a second electrode of the second reset transistor M10 is connected with reference level input terminal Vss.

In some embodiments, the shift register unit may be provided with an output reset module 600 to ensure that the output signal of the signal output terminal OUTPUT is pulled down in the output reset phase. As shown in FIG. 4 and FIG. 6, an input terminal of the output reset module 600 is connected with the reference level input terminal Vss, and an output terminal of the output reset module 600 is connected with the signal output terminal OUTPUT. The output reset module 600 further comprises a control terminal, namely, an output reset terminal RESET_OUTPUT. The output reset module 600 can put the input terminal and the output terminal of the output reset module 600 in conduction upon receipt of an active signal at the output reset terminal RESET_OUTPUT. Specifically, the output reset module 600 comprises an output reset transistor M4. A gate electrode of the output reset transistor M4 is formed as the control terminal of the output reset module 600, a first electrode of the output reset transistor M4 is formed as the output terminal of the output reset module 600, and a second electrode of the output reset transistor M4 is formed as the input terminal of the output reset module 600.

Figure 5:
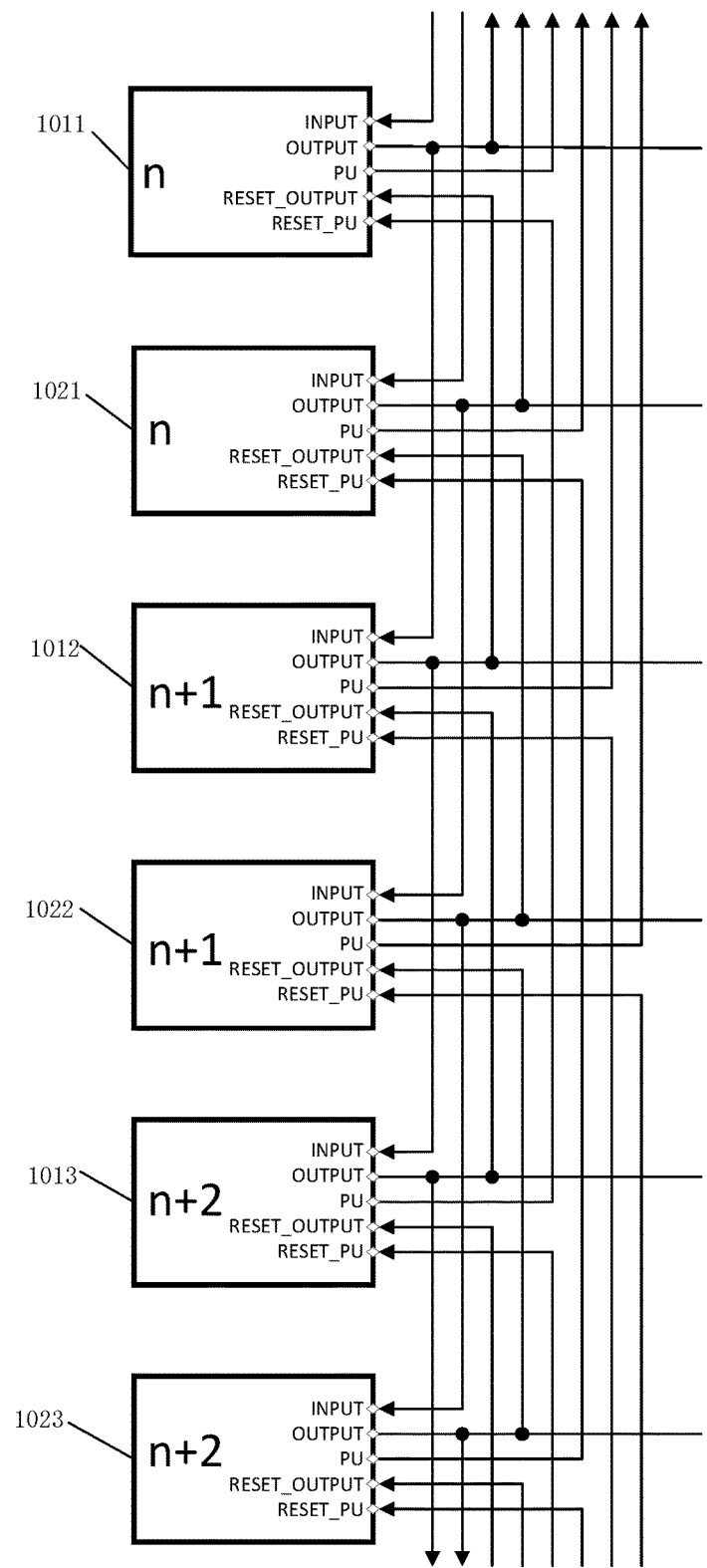
FIG. 5 is a schematic diagram of a shift register including the shift register unit shown in FIG. 4, according to an embodiment of the present disclosure.

In the exemplary circuit of the shift register unit shown in FIG. 4, the output reset terminal RESET_OUTPUT is a terminal independent from the pull-up node reset terminal RESET_PU. The shift registers as shown in FIG. 1 and FIG. 5 comprise such shift register units, wherein the shift register shown in FIG. 1 comprises one shift register unit group, and the shift register shown in FIG. 5 comprises two shift register unit groups. As shown, the signal output terminal OUTPUT of the (n+1)-th stage of shift register unit of each shift register unit group is connected to the output reset terminal RESET_OUTPUT of the n-th stage of shift register unit of the shift register unit group.

Figure 7:
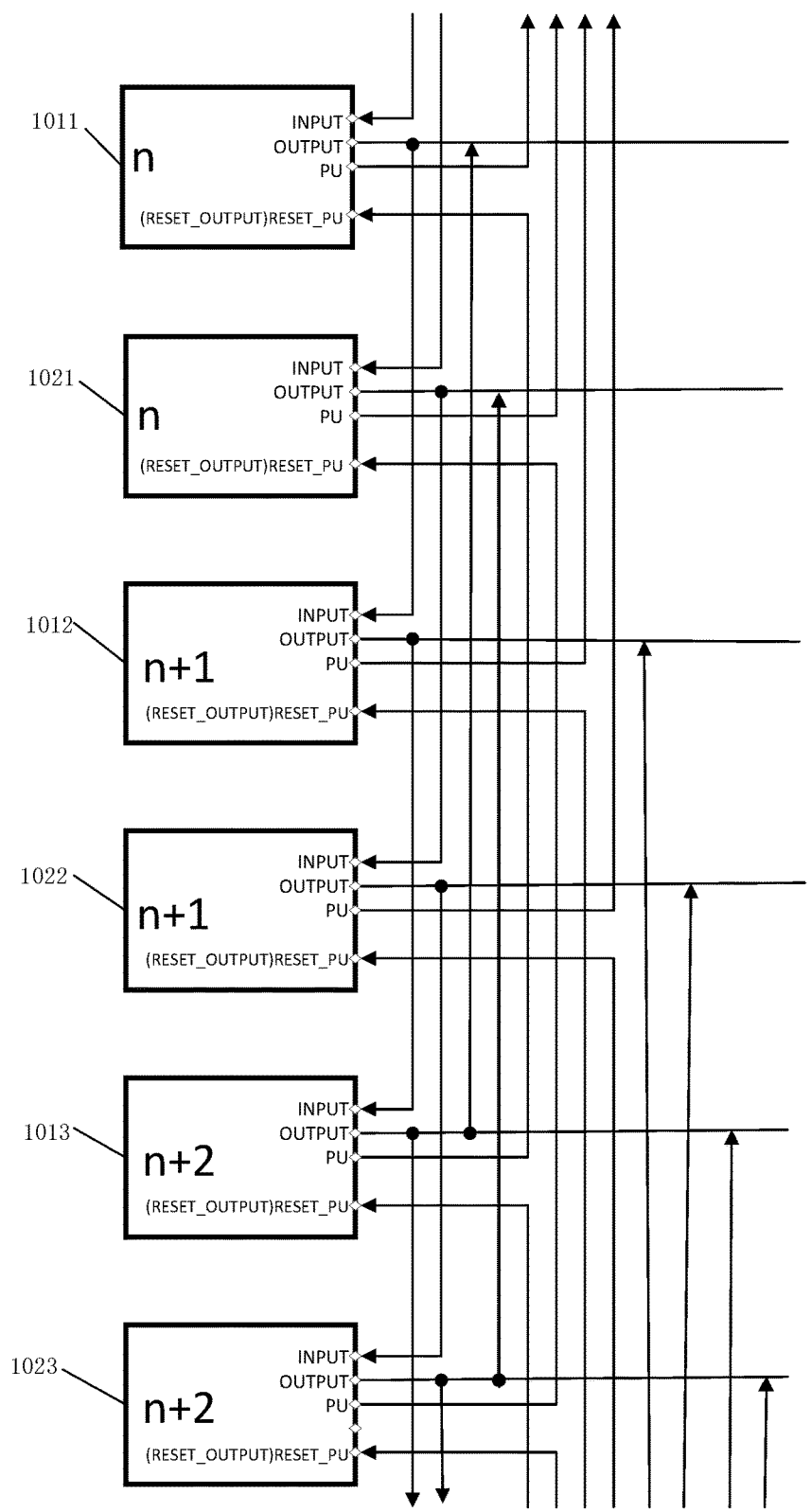
FIG. 7 is a schematic diagram of a shift register including the shift register unit shown in FIG. 6, according to an embodiment of the present disclosure.

In the exemplary circuit of the shift register unit shown in FIG. 6, the output reset terminal RESET_OUTPUT is connected with the pull-up node reset terminal RESET_PU. The shift register as shown in FIG. 7 comprises such shift register units, wherein the pull-up node reset terminal RESET_PU and the output reset terminal RESET_OUT of each shift register unit are merged into one terminal. The shift register comprises two shift register unit groups. As shown, the pull-up node PU of the (n+2)-th stage of shift register unit of each shift register unit group is connected to the pull-up node reset terminal RESET_PU of the n-th stage of shift register unit of the shift register unit group. Thus, the pull-up node PU of the (n+2)-th stage of shift register unit of each shift register unit group provides a control signal to the control terminal RESET_OUTPUT of the output reset module 600 of the n-th stage of shift register unit of the shift register unit group.

In embodiments, a start signal STV for a next frame may be used to reset the last k stages of shift register units of each of the shift register unit groups. In some embodiments, each shift register unit group may further comprise k stages of additional dummy shift register units. The k stages of dummy shift register units provide pull-up node reset signals for the last k stages of shift register units in the shift register unit group, respectively. It will be appreciated that the "dummy shift register units" here are only used to provide the reset signals, not to provide scanning signals to the gate lines.

Figure 8:
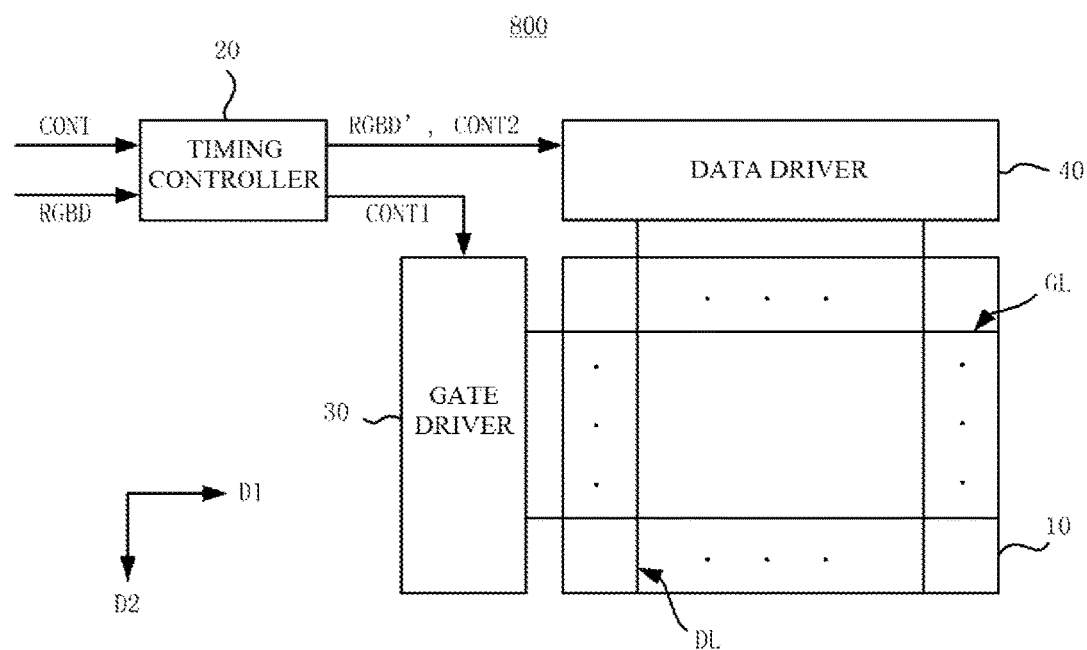
FIG. 8 is a block diagram of a display apparatus according to an embodiment of the present disclosure.

FIG. 8 is a block diagram of a display apparatus 800 according to an embodiment of the present disclosure.

As shown in FIG. 8, the display apparatus 800 comprises a display panel 10, a timing controller 20, a gate driver 30 and a data driver 40.

The display panel 10 is connected to a plurality of gate lines GL and a plurality of data lines DL. The display panel 10 displays images having multiple gray levels based on output pixel data RGBD'. The gate lines GL may extend in a first direction D1, and the data lines DL may extend in a second direction D2 intersecting (e.g., substantially perpendicular to) the first direction D1.

The display panel 10 may comprise a plurality of pixels (not shown) arranged in a matrix. Each pixel may be electrically connected to a corresponding one of the gate lines GL and a corresponding one of the data lines DL.

The timing controller 20 controls operations of the display panel 10, the gate driver 30 and the data driver 40. The timing controller 20 receives input image data RGBD and an input control signal CONT from an external device (e.g., a host machine). The input image data RGBD may comprise multiple input pixel data for multiple pixels. Each input pixel data may comprise red gray-level data R, green gray-level data G and blue gray-level data B for a corresponding of the multiple pixels. The input control signal CONT may comprise a main clock signal, a data enable signal, a vertical synchronization signal, a horizontal synchronization signal, and the like.

The timing controller 20 generates the output image data RGBD', a first control signal CONT1 and a second control signal CONT2 based on the input image data RGBD and the input control signal CONT.

For example, the timing controller 20 may generate the output image data RGBD' based on the input image data RGBD. The output image data RGBD' may be provided to the data driver 40. In some embodiments, the output image data RGBD' may be image data substantially identical with the input image data RGBD. In some embodiments, the output image data RGBD' may be compensated image data generated by compensating the input image data RGBD. The output image data RGBD' may comprise multiple output pixel data for multiple pixels.

The timing controller 20 may generate the first control signal CONT1 based on the input control signal CONT. The first control signal CONT1 may be provided to the gate driver 30, and the driving timing of the gate driver 30 may be controlled based on the first control signal CONT1. The first control signal CONT1 may comprise a vertical start signal, a gate clock signal, and the like. The timing controller 20 may generate the second control signal CONT2 based on the input control signal CONT. The second control signal CONT2 may be provided to the data driver 40, and the driving timing of the data driver 40 may be controlled based on the second control signal CONT2. The second control signal CONT2 may comprise a horizontal start signal, a data clock signal, a data load signal, a polarity control signal, and the like.

The gate driver 30 receives the first control signal CONT1 from the timing controller 20. The gate driver 30 generates multiple gate signals for driving the gate lines GL based on the first control signal CONT1. The gate driver 30 may sequentially apply the multiple gate signals to the gate lines GL.

The gate driver 30 may comprise the shift register as described in the above embodiments. In an embodiment in which the shift register comprises two shift register unit groups, one shift register unit group may be used to provide scanning signals to odd rows of gate lines, and the other shift register unit group may be used to provide scanning signals to even rows of gate lines.

The data driver 40 receives the second control signal CONT2 and the input image data RGBD' from the timing controller 20. The data driver 40 generates multiple data voltages (e.g., analog data voltage) based on the second control signal CONT2 and the output image data RGBD' (e.g., digital image data). The data driver 40 may apply the multiple data voltages to the data lines DL.

In some exemplary embodiments, the gate driver 30 and/or the data driver 40 may be disposed (e.g., directly mounted) on the display panel 10, or may be connected to the display panel 10 via, for example, a tape carrier package (TCP). In some embodiments, the gate driver 30 and/or the data driver 40 may be integrated in the display panel 10.

By way of example, and not limitation, the display apparatus 800 may be an electronic device such as a TV set, mobile phone, a tablet computer, a laptop computer, a desktop computer or a navigator.

It is to be appreciated that the above embodiments are described only for illustration of the principles of the present disclosure; the present disclosure is however not limited thereto. Various variations and modifications may be made by those having ordinary skill in the art without departing from the spirit and essence of the present disclosure, and these variations and modifications also fall within the protection scope of the present disclosure.

What is claimed is:

1. A shift register, comprising:
   at least one shift register unit group each comprising a
      plurality of stages of shift register units cascaded to one another, each of the plurality of stages of shift register units comprising a pull-up node and a pull-up node reset terminal, wherein the pull-up node of an (n+k)-th stage of shift register unit of each shift register unit group is connected to the pull-up node reset terminal of an n-th stage of shift register unit of the shift register unit group to provide a pull-up node reset signal allowing a potential at the pull-up node of the n-th stage of shift register unit to reset, the reset of the potential at the pull-up node causing an output signal at a signal output terminal of the n-th stage of shift register unit to reset, wherein n is an integer larger than or equal to 1, and k is an integer larger than 1, wherein each of the plurality of stages of shift register units further comprises a signal input terminal, a signal output terminal, a first clock signal terminal, a second clock signal terminal, an input circuit, a pull-up circuit, a pull-down circuit, a pull-down control circuit, a pull-up node reset circuit and a reference level input terminal, wherein:

the input circuit has an input terminal connected with the signal input terminal and an output terminal connected with the pull-up node the input circuit being configured to put the input terminal and the output terminal of the input circuit in conduction in response to receipt of an active signal at the input terminal of the input circuit;

the pull-up circuit has an input terminal connected to the first clock signal terminal, an output terminal connected with the signal output terminal, and a control terminal connected with the pull-up node, the pull-up circuit being configured to put the input terminal and the output terminal of the pull-up circuit in conduction in response to receipt of an active signal at the control terminal of the pull-up circuit;

the pull-down circuit has an input terminal connected with t reference level input terminal, an output terminal connected with the signal output terminal, and a control terminal connected with the pull-down node, the pull-down circuit being configured to put the input terminal and the output terminal of the pull-down circuit in conduction in response to receipt of an active signal at the control terminal of the pull-down circuit;

the pull-down control circuit has an input terminal connected with the second clock signal terminal, an output terminal connected with the pull-down node, and a control terminal connected with the pull-up node, the pull-down control circuit being configured to put the input terminal and the output terminal of the pull-down control circuit in conduction in response to receipt of an active signal at the control terminal of the pull-down control circuit; and the pull-up node reset circuit has an input terminal connected with the reference level input terminal, an output terminal connected with the pull-up node, and a control terminal connected with the pull-up node reset terminal.

2. The shift register of claim 1, wherein the input circuit comprises a first input transistor and a second input transistor, wherein:

the first input transistor has a first electrode, a gate electrode connected with the first electrode and formed as the input terminal of the input circuit, and a second electrode formed as the output terminal of the input circuit; and the second input transistor has a first electrode connected with the first electrode of the first input transistor, a gate electrode connected with the second clock signal terminal, and a second electrode connected with the second electrode of the first input transistor.

3. The shift register of claim 1, wherein the pull-up circuit comprises:

a pull-up transistor having a gate electrode formed as the control terminal of the pull-up circuit, a first electrode formed as the input terminal of the pull-up circuit, and a second electrode formed as the output terminal of the pull-up circuit; and a storage capacitor having a first terminal connected with the pull-up node and a second terminal connected with the signal output terminal.

4. The shift register of claim 1, wherein the pull-down circuit comprises a pull-down transistor having a gate electrode formed as the control terminal of the pull-down circuit, a first electrode formed as the output terminal of the pull-down circuit, and a second electrode formed as the input terminal of the pull-down circuit.

5. The shift register of claim 1, wherein the pull-down control circuit comprises a first pull-down control transistor, a second pull-down control transistor, a third pull-down control transistor, a fourth pull-down control transistor and a fifth pull-down control transistor, wherein:

the first pull-down control transistor has a gate electrode and a first electrode jointly connected with the second clock signal terminal, and a second electrode;

the second pull-down control transistor has a gate electrode connected with the second electrode of the first pull-down control transistor, a first electrode connected with the second clock signal terminal, and a second electrode connected with the pull-down node;

the third pull-down control transistor has a gate electrode connected with the pull-up node, a first electrode connected with the second electrode of the first pull-down control transistor, and a second electrode connected with the reference level input terminal;

the fourth pull-down control transistor has a gate electrode connected with the pull-up node, a first electrode connected with the pull-down node, and a second electrode connected with the reference level input terminal; and the fifth pull-down control transistor has a gate electrode connected with the second clock signal terminal, a first electrode connected with the signal output terminal, and a second electrode connected with the reference level input terminal.

6. The shift register of claim 1, wherein the pull-up node reset circuit comprises:

a first reset transistor having a gate electrode connected with the pull-up node reset terminal, a first electrode connected with the pull-up node, and a second electrode connected with the reference level input terminal; and a second reset transistor having a gate electrode connected with the pull-down node, a first electrode connected with the pull-up node, and a second electrode connected with reference level input terminal.

7. The shift register of claim 1, wherein each of the plurality of stages of shift register units further comprises an output reset circuit having an input terminal connected with the reference level input terminal, an output terminal connected with the signal output terminal, and a control terminal.

8. The shift register of claim 7, wherein for each of the plurality of stages of shift register units, the control terminal of the output reset circuit is connected with the pull-up node reset terminal of the shift register unit.

9. The shift register of claim 7, wherein the signal output terminal of an (n+1)-th stage of shift register unit of each shift register unit group is connected to the control terminal of the output reset circuit of an n-th stage of shift register unit of the shift register unit group.

10. The shift register of claim 7, wherein the output reset circuit comprises an output reset transistor having a gate electrode formed as the control terminal of the output reset circuit, a first electrode formed as the output terminal of the output reset circuit, and a second electrode formed as the input terminal of the output reset circuit.

11. The shift register of claim 1, wherein the shift register comprises two shift register unit groups.

12. The shift register of claim 1, wherein each shift register unit group further comprises k stages of dummy shift register units to provide respective pull-up node reset signals for last k stages of shift register units in the shift register unit group.

13. A gate driving circuit, comprising the shift register of claim 1.

14. A display apparatus, comprising the gate driving circuit of claim 13.

15. The display apparatus of claim 14, wherein the shift register comprises two shift register unit groups, wherein one shift register unit group is used to provide scanning signals to odd rows of gate lines of the display apparatus, and the other shift register unit group is used to provide scanning signals to even rows of gate lines of the display apparatus.

16. A gate driving circuit, comprising the shift register of claim 2.

17. A gate driving circuit, comprising the shift register of claim 3.

18. A gate driving circuit, comprising the shift register of claim 4.

* * * * *